(12) United States Patent
Hashimoto

(10) Patent No.: US 6,774,379 B2
(45) Date of Patent: Aug. 10, 2004

(54) ELECTRON BEAM EXPOSURE APPARATUS AND DEFLECTION AMOUNT CORRECTION METHOD

(75) Inventor: Shin-ichi Hashimoto, Tokyo (JP)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 10/661,702

(22) Filed: Sep. 12, 2003

(65) Prior Publication Data

US 2004/0094726 A1 May 20, 2004

(30) Foreign Application Priority Data

Oct. 21, 2002 (JP) .................................... 2002-306270

(51) Int. Cl.[7] ............................................ H01J 37/317

(52) U.S. Cl. ............... 250/492.22; 250/398; 250/396 R

(58) Field of Search ........................... 250/492.22, 398, 250/396 R, 492.2

(56) References Cited

U.S. PATENT DOCUMENTS 5,334,846 A * 8/1994 Nakano et al. .......... 250/492.2

FOREIGN PATENT DOCUMENTS

JP          62-277724       12/1987

* cited by examiner

Primary Examiner—Kiet T. Nguyen
(74) Attorney, Agent, or Firm—Muramatsu & Associates

(57) ABSTRACT

An electron beam exposure apparatus for exposing a pattern on a wafer by an electron beam. The electron beam exposure apparatus includes: an electron beam generating section for generating the electron beam; a deflecting section for deflecting the electron beam in order to apply the electron beam to a desired position on the wafer; a wafer stage on which the wafer is mounted; a stage position measuring section for measuring position of the wafer stage at a first time point and at a second time point which is later than the first time point; a stage speed computing section for computing moving speed of the wafer stage based on the position of the wafer stage at the first time point and the position of the wafer stage at the second time point measured by the stage position measuring section; and a deflection amount correction section for computing position of the wafer stage at exposure time based on the moving speed of the wafer stage measured by the stage speed computing section, and for controlling deflection amount of the electron beam to be deflected by the deflecting section at the exposure time. The electron beam exposure apparatus improves throughput and exposure accuracy of the exposure processing.

9 Claims, 5 Drawing Sheets

ELECTRON BEAM EXPOSURE APPARATUS AND DEFLECTION AMOUNT CORRECTION METHOD

This patent application claims priority from a Japanese patent application No. 2002-306270 filed on Oct. 21, 2002, the contents of which are incorporated herein by reference.

BACKGROUND OF THE INVENTION

1. Field of the Invention

The present invention relates to an electron beam exposure apparatus and a deflection amount compensation method. More particularly, the present invention relates to an electron beam exposure apparatus and a deflection amount correction method for controlling deflection amount of an electron beam based on a position of a wafer stage.

2. Description of Related Art

In a conventional electron beam exposure apparatus, after the wafer stage is driven for specifying the position at which an electron beam is to be applied on the wafer, the wafer stage has to be stopped during the exposure processing. However, according to the above-mentioned method, it takes some times to start and stop the wafer stage, and consequently it takes a lot of time to perform the exposure processing. To solve the problem, a Japanese Patent Unexamined Publication No. 1987-277724 discloses an electron beam exposure system for exposing a wafer mounted on the continuously moving wafer stage by periodically measuring the position of the wafer stage during the exposure processing, and controlling deflectors and driving the wafer stage continuously in accordance with the measurement result.

Recently, semiconductor devices have been highly miniaturized. Therefore, it is required to improve exposure precision of the exposure apparatus for writing pattern of semiconductor devices. Moreover, demand for mass production of the semiconductor devices is increasing and it is also required to improve throughput of the exposure apparatus. As the result, there is a tendency for moving speed of the wafer stage to increase, which causes deterioration of the exposure accuracy.

SUMMARY OF THE INVENTION

Therefore, it is an object of the present invention to provide an electron beam exposure apparatus and a deflection amount compensation method which can solve the foregoing problem. The above and other objects can be achieved by combinations described in the independent claims. The dependent claims define further advantageous and exemplary combinations of the present invention.

According to a first aspect of the present invention, there is provided an electron beam exposure apparatus for exposing a pattern on a wafer by an electron beam. The electron beam exposure apparatus includes: an electron beam generating section for generating the electron beam; a deflecting section for deflecting the electron beam in order to apply the electron beam to a desired position on the wafer; a wafer stage on which the wafer is mounted; a stage position measuring section for measuring position of the wafer stage at a first time point and at a second time point which is later than the first time point; a stage speed computing section for computing moving speed of the wafer stage based on the position of the wafer stage at the first time point and the position of the wafer stage at the second time point, which are measured by the stage position measuring section; and a deflection amount correction section for computing position of the wafer stage at exposure time based on the moving speed of the wafer stage measured by the stage speed computing section, and for controlling deflection amount of the electron beam to be deflected by the deflecting section at the exposure time.

The stage speed computing section may include: a first stage position storage section storing thereon the position of the wafer stage at the first time point; a second stage position storage section storing thereon the position of the wafer stage at the second time point; and a gradient computing section for computing the moving speed of the wafer stage based on the position of the wafer stage at the first time point stored on the first stage position storage section and the position of the wafer stage at the second time point stored on the second stage position storage section. The deflection amount correction section may include: a first deflection data generating section for generating a first deflection data, which is to be supplied to the deflecting section, based on the position of the wafer stage at the second time point stored on the second stage position storage section; and a second deflection data generating section for generating a second deflection data indicating the deflection amount corresponding to the moving distance of the wafer stage during a time interval between the second time point and the exposure time based on the moving speed of the wafer stage computed by the gradient computing section. The deflection amount correction section may supply the first deflection data and the second deflection data to the deflecting section.

The deflection amount correction section may further include an adding section for adding the first deflection data and the second deflection data, and supplying the added data to the deflecting section. The deflecting section may include: a first deflector for deflecting the electron beam based on the first deflection data; and a second deflector for deflecting the electron beam based on the second deflection data. The deflection amount correction section may supply the first deflection data to the first deflector, and supply the second deflection data to the second deflector.

The second deflection data generating section may compute the moving distance of the wafer stage during a time interval between the second time point and the exposure time by accumulating the moving distance per unit time whenever the unit time is elapsed, the moving distance per unit time being computed by the gradient computing section based on the moving speed of the wafer stage, and the unit time being shorter than the time interval between the first time point and the second time point, and then the second deflection data generating section generates the second deflection data indicating the deflection amount corresponding to the moving distance of the wafer stage during the time interval between the second time point and the exposure time.

The second deflection data generating section may compute the moving distance of the wafer stage during the time interval between the second time point and the exposure time by accumulating the moving distance per unit time whenever the unit time is elapsed after the second deflection data is initialized synchronizing with generation of the first deflection data by the first deflection data generating section.

The stage position measuring section may measure position of the wafer stage at a predetermined time interval, the first stage position storage section and the second stage position storage section may update the position of the wafer stage to store whenever the stage position measuring section measures the position of the wafer stage, the first deflection data generating section may acquire exposure data including information indicating the exposure position on the wafer, and generate the first deflection data based on the position of the wafer stage stored on the second stage position storage section when the exposure data are acquired, and the gradient computing section may compute the moving speed of the wafer stage based on the position of the wafer stage stored on the first stage position storage section and the second stage position storage section when the first deflection data generating section acquires the exposure data.

According to a second aspect of the present invention, there is provided an electron beam irradiation apparatus for irradiating an electron beam to a predetermined position in an object. The electron beam irradiation apparatus includes: an electron beam generating section for generating the electron beam; a deflecting section for deflecting the electron beam in order to apply the electron beam to a desired position on the object; a stage on which the object is mounted; a stage position measuring section for measuring position of the stage at a first time point and at a second time point which is later than the first time point; a stage speed computing section for computing moving speed of the stage based on the position of the stage at the first time point and the position of the stage at the second time point, which are measured by the stage position measuring section; and a deflection amount correction section for computing position of the stage at exposure time based on the moving speed of the stage measured by the stage speed computing section, and for controlling deflection amount of the electron beam to be deflected by the deflecting section at the exposure time.

According to a third aspect of the present invention, there is provided a deflection amount correction method for correcting deflection amount of an electron beam deflected by a deflecting section based on position of a wafer stage on which a wafer is mounted in an electron beam exposure apparatus for exposing a pattern on the wafer by the electron beam. The deflection amount correction method includes steps of: measuring position of the wafer stage at a first time point and at a second time point which is later than the first time point; computing moving speed of the wafer stage based on the position of the wafer stage at the first time point and the position of the wafer stage at the second time point; and computing position of the wafer stage at exposure time based on the moving speed of the wafer stage, and controlling deflection amount of the electron beam at the exposure time.

The summary of the invention does not necessarily describe all necessary features of the present invention. The present invention may also be a sub-combination of the features described above.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
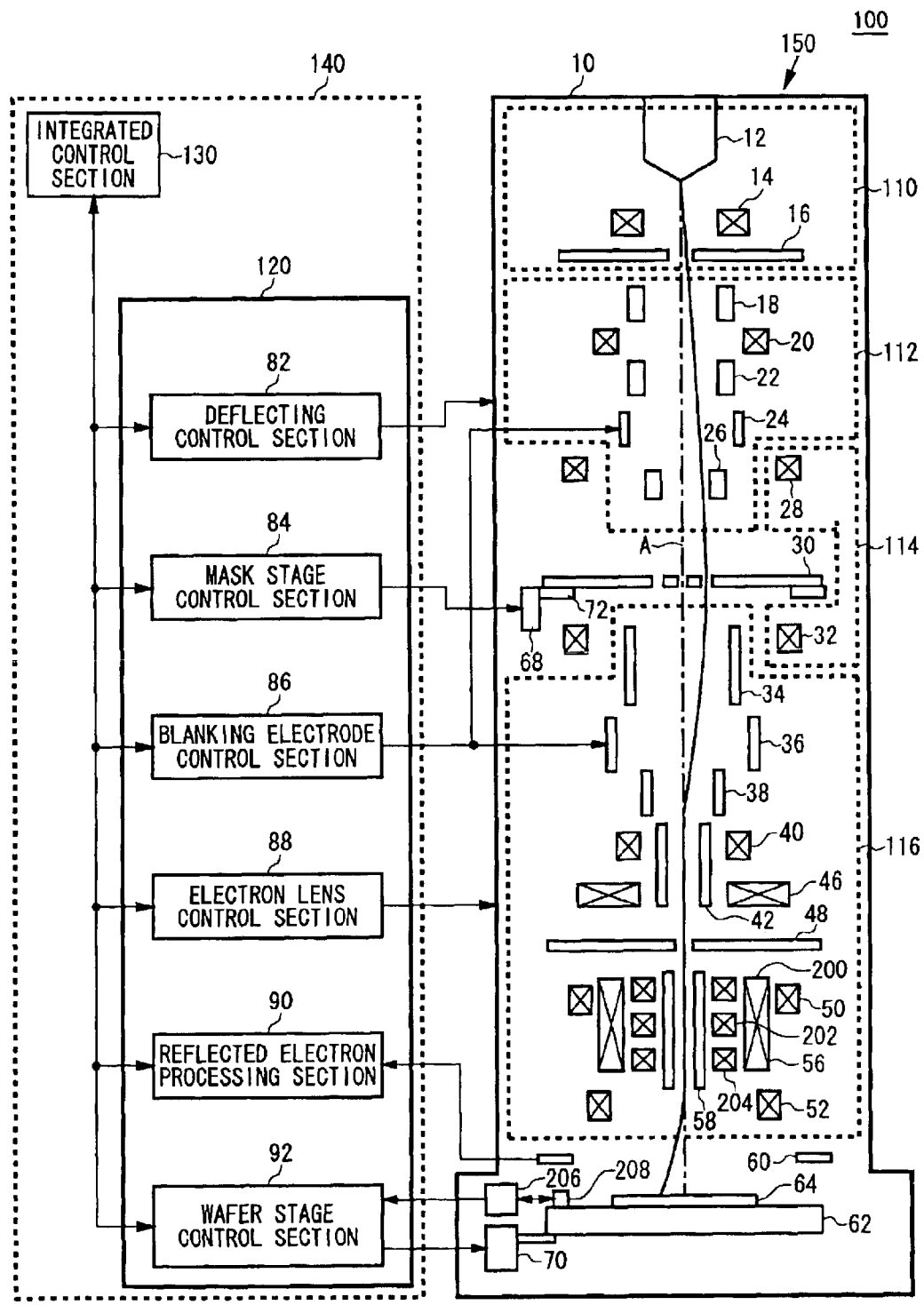
FIG. 1 is a schematic view exemplary showing a configuration of an electron beam exposure apparatus.

FIG. 1 is a block diagram of an electron beam exposure apparatus 100 according to an embodiment of the present invention. The electron beam exposure apparatus 100 includes an exposure section 150 for performing predetermined exposure processing on a wafer 64 by an electron beam, and a control system 140 for controlling operation of each configuration of the exposure section 150.

The exposure section 150 includes an electron optics system, which includes: an electron beam discharge system 110 for discharging a predetermined electron beam into a tube 10; a mask projection system 112 for deflecting the electron beam discharged from the electron beam discharge system 110 and for adjusting a focal point of the electron beam in the vicinity of a mask 30; a focal point adjustment lens system 114 for adjusting focusing condition of the electron beam before and after the electron beam passes through the mask 30; and a wafer projection system 116 for deflecting the electron beam, which has passed through the mask 30, to a predetermined area of the wafer 64 mounted on a wafer stage 62, and for adjusting a direction and a size of an image of a pattern which is to be exposed on the wafer 64.

Moreover, the exposure section 150 includes: a mask 30 including a plurality of aperture patterns, each of which is shaped into a shape which is to be exposed on the wafer 64; a mask stage 72 on which the mask 30 is mounted; a mask stage drive section 68 for driving the mask stage 72; a wafer stage 62 on which the wafer 64 is mounted, where the patterns are to be exposed on the wafer; a wafer stage drive section 70 for driving the wafer stage 62; a laser length measuring apparatus 206 for measuring position of the wafer stage 62 by irradiating a laser beam to a mirror 208 provided on the wafer stage 62; and an electron detector 60 for detecting electrons scattered from a direction of the wafer stage 62 and converting the quantity of the scattered electrons into corresponding electrical signal. In addition, the laser length measuring apparatus 206 is an example of a stage position measuring section of the present invention.

The electron beam discharge system 110 includes: an electron gun 12, which is an example of an electron beam generating section for generating an electron beam; a first electron lens 14 for focusing the electron beam; and a slit section 16 with an aperture (slit) having a rectangle shape through which the electron beam passes. An alternate long and short dash line A in FIG. 1 indicates an optical axis of the electron beam discharged from the electron beam discharge system 110 when the electron beam is not deflected by the electron optics system.

The mask projection system 112 includes: a first deflector 18, a second deflector 22 and a third deflector 26 as a deflecting system for the mask for deflecting the electron beam; a second electron lens 20 as a focus system for the mask for adjusting a focal point of the electron beam; and a first blanking electrode 24. Moreover, the focal point adjustment lens system 114 includes a third electron lens 28 and a fourth electron lens 32.

The first deflector 18 and the second deflector 22 deflect the electron beam to a predetermined area on the mask 30. The image of the electron beam which has passed through the aperture of the mask 30 is defined as a pattern image, where the aperture is shaped into a predetermined shape. The third deflector 26 deflects the electron beam which has passed through the first deflector 18 and the second deflector 22 to a direction substantially parallel with the optical axis A. The second electron lens 20 has a function for focusing the image of the aperture of the slit section 16 onto the mask 30 mounted on the mask stage 72.

The first blanking electrode 24 deflects the electron beam so that the electron beam may not be irradiated on the aperture pattern formed in the mask 30. Since the pattern formed in the mask 30 deteriorates as the electron beam is irradiated onto it, the first blanking electrode 24 deflects the electron beam unless the pattern is to be exposed on the wafer 64, and prevents the deterioration of the mask 30. The third electron lens 28 and the fourth electron lens 32 adjust the focusing condition of the electron beam before and after the electron beam passes through the mask 30, respectively.

The wafer projection system 116 includes a fifth electron lens 40, a sixth electron lens 46, a seventh electron lens 50, an eighth electron lens 52, a fourth deflector 34, a fifth deflector 38, a sixth deflector 42, a main deflector 56, a sub deflector 58, a second blanking electrode 36, a round aperture section 48, an astigmatism coil 200, an SEM coil 202, and a feedback coil 204.

The fifth electron lens 40 adjusts the rotation of the pattern image of the electron beam which has passed through a predetermined aperture pattern in the mask 30. The sixth electron lens 46 and the seventh electron lens 50 adjust the reduction ratio of the pattern image exposed on the wafer 64 to the aperture pattern formed in the mask 30. The eighth electron lens 52 functions as an objective lens. The fourth deflector 34 and the sixth deflector 42 deflect the electron beam toward the direction of the optical axis A below the mask 30. The fifth deflector 38 deflects the electron beam to the direction substantially parallel with the optical axis A.

The astigmatism coil 200 corrects astigmatism of the electron beam dynamically. The feedback coil 204 deflects the electron beam in order to apply the electron beam on a desired position of the wafer 64. The main deflector 56 and the sub deflector 58 deflect the electron beam so that the electron beam is applied on the predetermined area of the wafer 64. In the present embodiment, the main deflector 56 is used for deflecting the electron beam between a plurality of subfields, each of which includes a plurality of areas which can be irradiated by single shot of the electron beam (to be referred to as shot area hereinafter), and the sub deflector 58 is used for the deflection between the shot areas in the subfield.

The round aperture section 48 includes a circular aperture (round aperture). The second blanking electrode 36 prevents the electron beam going to the downstream of the round aperture section 48 by deflecting the electron beam so that it hits outside of the round aperture. Since the electron gun 12 continuously discharges the electron beam during the period of the exposure processing, the second blanking electrode 36 deflects the electron beam so that the electron beam may not go to downstream of the round aperture section 48 when changing the pattern to be exposed on the wafer 64, or when changing areas in the wafer 64 on which the pattern is to be exposed.

The control system 140 includes an integrated control section 130 and an individual control section 120. The individual control section 120 includes a deflecting control section 82, a mask stage control section 84, a blanking electrode control section 86, an electron lens control section 88, a reflected electron processing section 90, and a wafer stage control section 92. For example, the integrated control section 130 is a work station and collectively controls each control section of the individual control section 120.

The deflecting control section 82 controls the deflection amount of the first deflector 18, the second deflector 22, the third deflector 26, the fourth deflector 34, the fifth deflector 38, the sixth deflector 42, the main deflector 56, the sub deflector 58, the astigmatism coil 200, the SEM coil 202, and the feedback coil 204. Moreover, the deflection control section 82 corrects the deflection amount of the sub deflector 58 based on the moving speed of the wafer stage 62. The mask stage control section 84 controls the mask stage drive section 68, and causes the mask stage 72 to move.

The blanking electrode control section 86 controls the first blanking electrode 24 and the second blanking electrode 36. The electron lens control section 88 controls the electric power supplied to the first electron lens 14, the second electron lens 20, the third electron lens 28, the fourth electron lens 32, the fifth electron lens 40, the sixth electron lens 46, the seventh electron lens 50, and the eighth electron lens 52. The reflected electron processing section 90 generates digital data indicating the amount of electrons based on the electrical signal detected by the electron detector 60, and supplies it to the integrated control section 130. The wafer stage control section 92 acquires the position of the wafer stage 62 measured by the laser length measuring apparatus 206, and causes the wafer stage drive section 70 to move the wafer stage 62 to a predetermined position.

Next, operation of the electron beam exposure apparatus 100 will be explained. The mask 30 including the plurality of aperture patterns, each of which is shaped into a predetermined pattern, is mounted on the mask stage 72, and the mask 30 is fixed to a predetermined position. The wafer stage control section 92 causes the wafer stage drive section 70 to move the wafer stage 62 continuously so that an area on the wafer 64 to be exposed may be located in the vicinity of the optical axis A. Moreover, since the electron gun 12 continuously discharges the electron beam during the period of the exposure processing, the blanking electrode control section 86 controls the first blanking electrode 24 and the second blanking electrode 36 so that the electron beam which has passed through the aperture of the slit section 16 is not applied to the mask 30 and the wafer 64 before starting the exposure processing.

In the mask projection system 112, the electron lens 20 and the deflectors (18, 22, 26) are adjusted so that the electron beam is applied to the aperture pattern in which the pattern to be exposed on the wafer 64 is formed. In the focal point adjustment lens system 114, the electron lenses (28, 32) are adjusted so as to focus the electron beam onto the wafer 64. Moreover, in the wafer projection system 116, the electron lenses (40, 46, 50, 52, 66), the deflectors (34, 38, 42, 56, 58), the astigmatism coil 200, and the feedback coil 204 are adjusted so that the pattern image is exposed on the predetermined area on the wafer 64.

After the mask projection system 112, the focal point adjustment lens system 114, and the wafer projection system 116 are adjusted, the blanking electrode control section 86 stops the deflection of the electron beam having been deflected by the first blanking electrode 24 and the second blanking electrode 36. Thereby, as described below, the electron beam is applied to the wafer 64 through the mask 30. The electron gun 12 generates the electron beam, and the first electron lens 14 focuses the electron beam so that it is applied to the slit section 16. Then, the first deflector 18 and the second deflector 22 deflect the electron beam, which has passed through the aperture of the slit section 16, to a predetermined area in the mask 30, in which the pattern to be exposed on the wafer 64 is formed. The electron beam which has passed through the aperture of the slit section 16 has rectangular cross-sectional shape. The electron beam deflected by the first deflector 18 and the second deflector 22 is further deflected by the third deflector 26 so that the electron beam is deflected to the direction substantially parallel with the optical axis A. Moreover, the electron beam is adjusted by the second electron lens 20 so that the image of the aperture of the slit section 16 is focused onto the predetermined area in the mask 30.

Then, the electron beam which has passed through the pattern formed in the mask 30 is deflected toward the direction of the optical axis A by the fourth deflector 34 and the sixth deflector 42, and it is further deflected by the fifth deflector 38 so that the electron beam is deflected to the direction substantially parallel with the optical axis A. Moreover, the electron beam is adjusted so that the image of the pattern formed in the mask 30 is focused onto the surface of the wafer 64 by the third electron lens 28 and the fourth electron lens 32, the rotation of the pattern image is adjusted by the fifth electron lens 40, and the reduction ratio of the pattern image is adjusted by the sixth electron lens 46 and the seventh electron lens 50. Then, the electron beam is deflected by the main deflector 56 and the sub deflector 58 so that the electron beam is applied to the predetermined shot area on the wafer 64. The main deflector 56 deflects an electron beam between subfields each of which includes the plurality of shot areas, and a sub deflector 58 deflects the electron beam between the shot areas in a subfield. Moreover, the sub deflector 58 deflects the electron beam according to the moving speed of the wafer stage 62, so that the electron beam is applied to the predetermined shot area. The electron beam deflected to the predetermined shot area is adjusted by an electron lens 52 and the electron lens 66, and then applied on the wafer 64. Thereby, the image of the pattern formed in the mask 30 is exposed on the predetermined shot area on the wafer 64.

After the predetermined exposure time has been elapsed, the blanking electrode control section 86 controls the first blanking electrode 24 and the second blanking electrode 36, and deflects the electron beam so that the electron beam may not be applied to the mask 30 or the wafer 64. By the above-described process, the pattern formed in the mask 30 is exposed on the predetermined shot area of the wafer 64. In order to expose the pattern formed in the mask 30 on the next shot area, the electron lens 20 and the deflectors (18, 22, 26) in the mask projection system 112 are adjusted so that the electron beam is applied to an aperture pattern having a desired pattern to be exposed on the wafer 64. In the focal point adjustment lens system 114, the electron lenses (28, 32) are adjusted so that the electron beam is focused onto the wafer 64. Moreover, in a wafer projection system 116, the electron lenses (40, 46, 50, 52, 66), the deflectors (34, 38, 42, 56, 58), the astigmatism coil 200, and the feedback coil 204 are adjusted so that the pattern image is exposed on the predetermined area of the wafer 64.

Specifically, the sub deflector 58 adjusts electric field so that the pattern image generated by the mask projection system 112 is exposed on the next shot area. Then, the pattern is exposed on the shot area in a similar manner as described above. After exposing patterns on all the shot areas, on which patterns are to be exposed, in the subfield, the main deflector 56 adjusts magnetic field so that the pattern is exposed on the next subfield. The electron beam exposure apparatus 100 exposes a desired circuit pattern on the wafer 64 by repeatedly performing the above-described exposure processing.

Alternatively, the electron beam exposure apparatus 100 is a variable rectangle exposure apparatus for writing a pattern to the wafer 64 by a variable rectangle beam, or it is a multi-beam exposure apparatus for writing a pattern to the wafer 64 by a plurality of electron beams. Moreover, the electron beam exposure apparatus 100 is an example of the electron beam irradiation apparatus of the present invention, and the wafer stage 62 and the wafer 64 are a stage and an object of the present invention, respectively. The electron beam irradiation apparatus of the present invention may be an electron microscope, an electron beam tester, etc., instead of the electron beam exposure apparatus.

Figure 2:
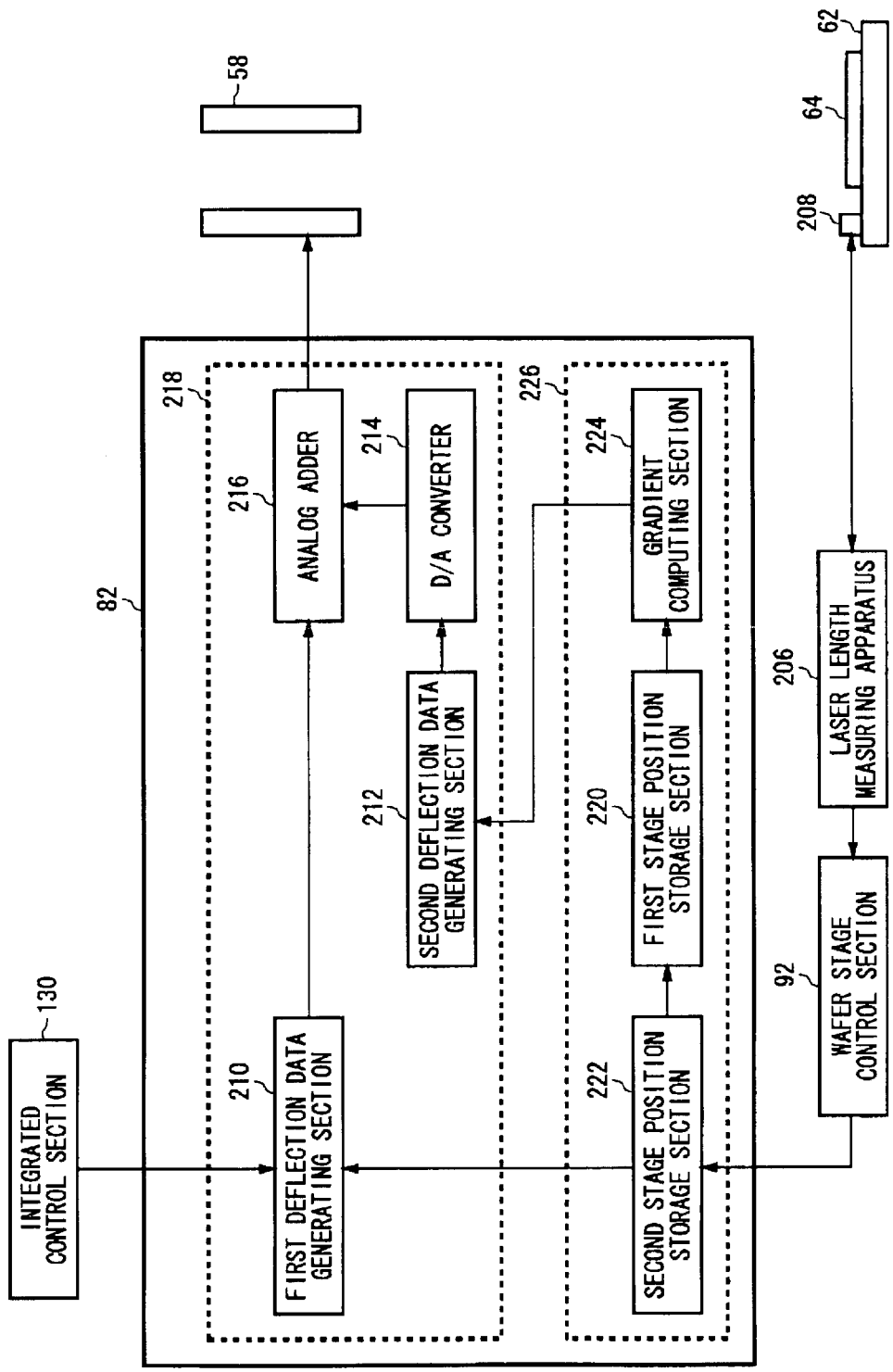
FIG. 2 is a block diagram exemplary showing a configuration of a deflection control section.

FIG. 2 is a block diagram exemplary showing a configuration of the deflection control section 82. The deflection control section 82 includes: a stage speed computing section 226 for computing moving speed of the wafer stage 62 based on the position of the wafer stage 62 measured at a plurality of time points detected by the laser length measuring apparatus 206; and a deflection amount correction section 218 for computing position of the wafer stage 62 at exposure time, which is time at which the electron beam is irradiated on the wafer 64, based on the moving speed of the wafer stage 62 computed by the speed computing section 226, and for controlling the deflection amount of the electron beam to be deflected by the sub deflector 58 at the exposure time.

The deflection amount correction section 218 includes a first deflection data generating section 210, a second deflection data generating section 212, a digital/analog converter 214, and an analog adder 216. Moreover, the stage speed computing section 226 includes a first stage position storage section 220, a second stage position storage section 222, and a gradient computing section 224. The first deflection data generating section 210, the second deflection data generating section 212, the digital/analog converter 214, and the gradient computing section 224 operate based on system control signal from the integrated control section 130.

The first stage position storage section 220 and the second stage position storage section 222 acquire and store the position of the wafer stage 62 measured by the laser length measuring apparatus 206 through the wafer stage control section 92. The laser length measuring apparatus 206 measures the position of the wafer stage 62 at a predetermined time interval, and every time the laser length measuring apparatus 206 measures the position of the wafer stage 62, the position of the wafer stage 62 stored on the second stage position storage section 222 is updated to the position of the wafer stage 62 measured by the laser length measuring apparatus 206. Moreover, every time the laser length measuring apparatus 206 measures the position of the wafer stage 62, i.e., every time the position of the wafer stage 62 stored on the second stage position storage section 222 is updated, the position of the wafer stage 62 stored on the first stage position storage section 220 is updated to the position of the wafer stage 62 which has been previously stored on the second stage position storage section 222 before the update of the data on the second stage position storage section 222.

That is, the laser length measuring apparatus 206 measures the position of the wafer stage 62 at a first time point and at a second time point, which is later than the first time point. In this case, the first stage position storage section 220 stores the position of the wafer stage 62 at the first time point, and the second stage position storage section 222 stores the position of the wafer stage 62 at the second time point. For example, the first stage position storage section 220 and the second stage position storage section 222 are registers synchronized with each other by supplying the same clock signal, and data are updated simultaneously.

The gradient computing section 224 computes the moving speed of the wafer stage 62 based on the position of the wafer stage 62 at the first time point stored on the first stage position storage section 220 and the position of the wafer stage 62 at the second time point stored on the second stage position storage section 222. Then, the gradient computing section 224 supplies the data indicating the moving speed of movements of the wafer stage 62, i.e., the moving distance per predetermined unit of time, to the second deflection data generating section 212.

The first deflection data generating section 210 acquires the exposure data including information indicating the exposure position on the wafer 64 from the integrated control section 130, and also acquires the position of the wafer stage 62 from the second stage position storage section 222 when the exposure data is acquired from integrated control section 130. The first deflection data generating section 210 generates the first deflection data to be supplied to the sub deflector 58 based on the position of the wafer stage 62 at the second time point stored on the second stage position storage section 222 and the exposure data acquired from the integrated control section 130. In addition, the first deflection data generating section 210 outputs analog signal, which is voltage applied to the sub deflector 58, as the first deflection data, and supplies it to the analog adder 216.

Moreover, the above-mentioned gradient computing section 224 computes the moving speed of the wafer stage 62 based on the position of the wafer stage 62 stored on the first stage position storage section 220 and the second stage position storage section 222 when the first deflection data generating section 210 acquires the exposure data from the integrated control section 130.

The second deflection data generating section 212 generates the second deflection data indicating the deflection amount corresponding to the moving distance of the wafer stage 62 between the second time point and the exposure time based on the moving speed of the wafer stage 62 computed by the gradient computing section 224, where the second time point is the time at which the position of the wafer stage 62 is measured being stored on the second stage position storage section 222, and the exposure time is the time at which the exposure processing is performed based on the exposure data acquired by the first deflection data generating section 210. That is, the second deflection data generating section 212 computes the moving distance of the wafer stage 62, then specifies the deflection amount corresponding to the computed moving distance and generates the second deflection data for correcting misalignment of the irradiation position of the electron beam caused by the movement of the wafer stage 62. Alternatively, the second deflection data generating section 212 is a DAC data generating circuit or a charge storage circuit including a current output circuit, a capacitor, etc.

The digital/analog converter 214 converts the second deflection data, which is digital signal generated by the second deflection data generating section 212, into the analog signal, which is the voltage applied to the sub deflector 58, and supplies it to the analog adder 216. The analog adder 216 adds the first deflection data, which is the analog signal output from the first deflection data generating section 210, and the second deflection data, which is the analog signal output from the digital/analog converter 214, and supplies it to the sub deflector 58.

Figure 3A:
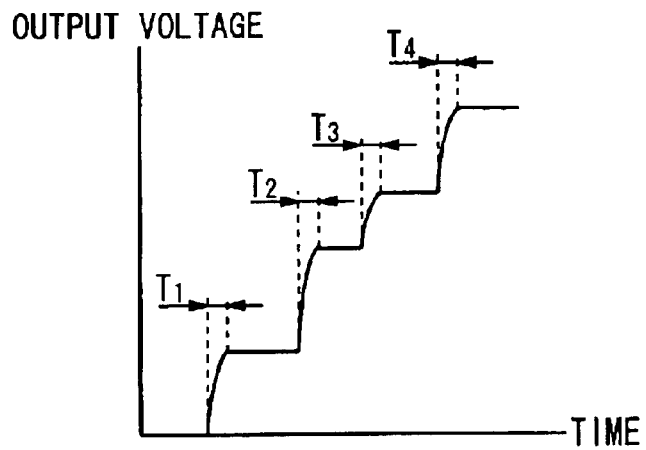
FIG. 3A is a graph exemplary showing a first deflection data generated by a first deflection data generating unit.

FIG. 3A is a graph exemplary showing the first deflection data generated by the first deflection data generating section 210. A vertical axis represents the output voltage output from the first deflection data generating section 210 as the first deflection data, and a horizontal axis represents time. On acquiring the exposure data from the integrated control section 130, the first deflection data generating section 210 specifies and outputs the voltage which is to be supplied to the sub deflector 58 based on the exposure position in the exposure data and the position of the wafer stage 62 stored on the second stage position storage section 222 at this time. Then, the first deflection data generating section 210 continuously outputs the specified voltage until it acquires the next exposure data from the integrated control section 130. On acquiring the next exposure data from the integrated control section 130, the first deflection data generating section 210 specifies and outputs the voltage which is to be supplied to the sub deflector 58 based on the exposure position in the exposure data and the position of the wafer stage 62 stored on the second stage position storage section 222 at this time. As described above, every time the first deflection data generating section 210 acquires the exposure data from the integrated control section 130, the output voltage supplied to the sub deflector 58 is updated.

Figure 3B:
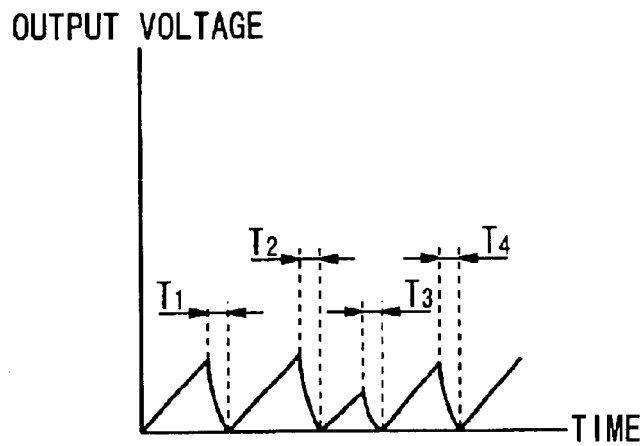
FIG. 3B is a graph exemplary showing a second deflection data generated by a second deflection data generating unit.

FIG. 3B is a graph exemplary showing the second deflection data generated by the second deflection data generating section 212. A vertical axis represents the output voltage output from the digital/analog converter 214 as the result of the D/A conversion of the second deflection data, and a horizontal axis represents time. On acquiring the exposure data from the first deflection data generating section 210, the second deflection data generating section 212 computes the moving distance of the wafer stage 62 during a time interval between the second time point and the exposure time by accumulating the moving distance per unit time whenever the unit time is elapsed based on the moving speed of the wafer stage 62 computed by the gradient computing section 224 at this time, where the second time point is the time at which the position of the wafer stage 62 is measured, the position being stored on the second stage position storage section 222. Then, the second deflection data generating section 212 generates and outputs the second deflection data indicating the deflection amount corresponding to the moving distance of the wafer stage 62 between the second time point and the exposure time. It is preferable that the unit time for accumulating and computing the moving distance per unit time is shorter than the time interval between the first time point and the second time point, i.e., measuring cycle of the laser length measuring apparatus 206, where the first time point is the time point at which the position of the wafer stage 62 is measured, the position being stored on the first stage position storage section 220, and the second time point is the time point at which the position of the wafer stage 62 is measured, the position being stored on the second stage position storage section 222.

Then, the second deflection data generating section 212 generates and outputs the second deflection data while accumulating the moving distance per unit time until the first deflection data generating section 210 acquires the next exposure data. Then, when the first deflection data generating section 210 acquires the next exposure data, the second deflection data generating section 212 initializes the second deflection data by clearing the accumulated value to zero. That is, the second deflection data generating section 212 initializes the second deflection data synchronizing with the generation of the first deflection data generated by the first deflection data generating section 210. Then, after the second deflection data has been initialized, the second deflection data generating section 212 generates the second deflection data by accumulating the moving distance per unit time based on the moving distance of the wafer stage 62 computed by the gradient computing section 224 at this time and outputs it. As described above, the second deflection data generating section 212 repeats the initialization and the accumulation of the second deflection data every time the first deflection data generating section 210 acquires the exposure data.

Figure 3C:
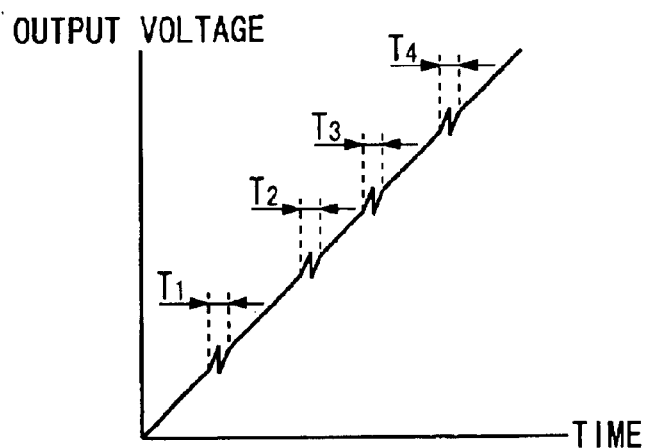
FIG. 3C is a graph exemplary showing output voltage of an analog adder.

FIG. 3C is a graph exemplary showing the output voltage of the analog adder 216. A vertical axis represents the output voltage of the analog adder 216, and a horizontal axis represents time. The analog adder 216 adds the first deflection data and the second deflection data and outputs it, where the first deflection data is the analog signals generated by the first deflection data generating section 210, and the second deflection data is generated by the second deflection data generating section 212 and converted into the analog signal by the digital/analog converter 214. That is, the output voltage shown in FIG. 3C is the sum of the output voltage shown in FIG. 3A and the output voltage shown in FIG. 3B.

In addition, in FIGS. 3A to 3C, each of $T_1$, $T_2$, $T_3$, and $T_4$ is a period from a time point at which each of the first deflection data generating section 210 and the digital/analog converter 214 begins to apply a predetermined voltage, to a time point at which the predetermined voltage is actually applied to the sub deflector 58 (settling time). During the settling time, since the sub deflector 58 is unable to deflect the electron beam stably, it is preferable that the blanking electrode control section 86 causes at least either the first blanking electrode 24 or the second blanking electrode 36 to deflect the electron beam so as to interrupt the exposure processing.

The wafer stage 62 is moving during the period from the acquisition of the exposure data until the next exposure data acquisition by the first deflection data generating section 210. Therefore, in case that only the output voltage based on the first deflection data generated by the first deflection data generating section 210 is applied to the sub deflector 58 to deflect the electron beam, the misalignment of the exposure position occurs during the period from the exposure data acquisition until the next exposure data acquisition by the first deflection data generating section 210, and the misalignment of the exposure position will increase gradually. However, the electron beam exposure apparatus 100 according to the present embodiment deflects the electron beam by applying the output voltage to the sub deflector 58 based on the second deflection data generated by the second deflection data generating section 212 corresponding to the moving distance of the wafer stage 62 in addition to the output voltage of the first deflection data generating section 210 during the period from the exposure data acquisition until the next exposure data acquisition by the first deflection data generating section 210, the misalignment of the exposure position during the period from the exposure data acquisition until the next exposure data acquisition by the first deflection data generating section 210 is reduced, so that the electron beam is applied to the desired position on the wafer 64.

Figure 4:
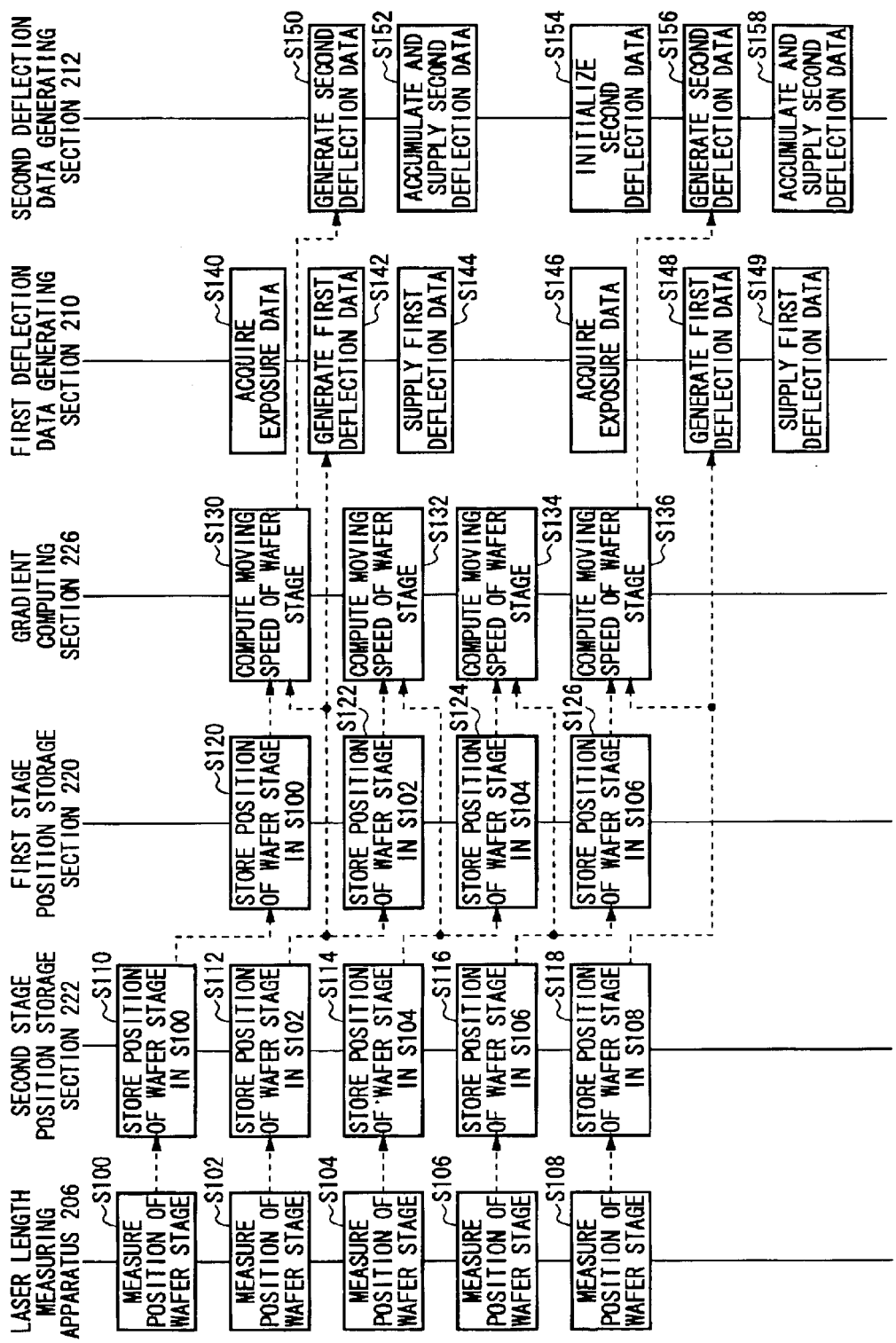
FIG. 4 is a flow chart exemplary showing flow of a deflection amount compensation method.

FIG. 4 is a flow chart exemplary showing a flow of a deflection amount correction method. The laser length measuring apparatus 206 measures the position of the wafer stage 62 at a predetermined time interval (S100, S102, S104, S106, S108). The second stage position storage section 222 stores the position of the wafer stage 62 measured by the laser length measuring apparatus 206 every time the laser length measuring apparatus 206 measures the position of the wafer stage 62 (S110, S112, S114, S116, S118). Moreover, every time the laser length measuring apparatus 206 measures the position of the wafer stage 62, the first stage position storage section 220 stores the position of the wafer stage 62, which has been stored in the second stage position storage section 222 at the previous measurement (S120, S122, S124, S126). Moreover, the gradient computing section 224 computes the moving speed of the wafer stage 62 based on the position of the wafer stage 62 at the first time point stored on the first stage position storage section 220, and the position of the wafer stage 62 at the second time point stored on the second stage storage section 222 every time the laser length measuring apparatus 206 measures the position of the wafer stage 62 (S130, S132, S132, S134, S136).

When the exposure data is acquired (S140), the first deflection data generating section 210 generates the first deflection data based on the position of the wafer stage 62 in S102 stored on the second stage position storage section 222 in S112 (S142) Then, the first deflection data generating section 210 supplies first deflection data to the sub deflector 58 (S144) until it acquires the next exposure data (S146). Moreover, when the first deflection data generating section 210 acquires the exposure data (S140), the second deflection data generating section 212 generates the second deflection data based on the moving speed of the wafer stage 62 computed by the gradient computing section 224 in S130 (S150). Then, until the first deflection data generating section 210 acquires the next exposure data (S146), the second deflection data generating section 212 accumulates the second deflection data and supplies it to the sub deflector 58 (S152).

Next, when the next exposure data is acquired (S146), the first deflection data generating section 210 generates the first deflection data based on the position of the wafer stage 62 in S108 stored on the second stage position storage section 22 in S118 (S148), and supplies it to the sub deflector 58 (S149). Moreover, when the first deflection data generating section 210 acquires the next exposure data (S146), the second deflection data generating section 212 initializes the second deflection data (S154). Then, based on the moving speed of the wafer stage 62 computed by the gradient computing section 224 in S136, the second deflection data generating section 212 generates the second deflection data (S156), accumulates the data and supplies it to the sub deflector 58 (S158).

Similarly hereafter, every time the first deflection data generating section 210 acquires the exposure data, the first deflection data generating section 210 generates the first deflection data, the second deflection data generating section 212 generates the second deflection data, and the deflection control section 82 supplies the first deflection data and the second deflection data to the sub deflector 58.

According to the electron beam exposure apparatus 100 in the present embodiment, the deflection amount of the electron beam by the sub deflector 58 is controllable with the movement of the wafer stage 62. Therefore, since the pattern is exposed with sufficient accuracy on the wafer 64 even if the moving speed of the wafer stage 62 is fast, the improvement in the throughput and the improvement in the exposure accuracy are realizable.

Figure 5:
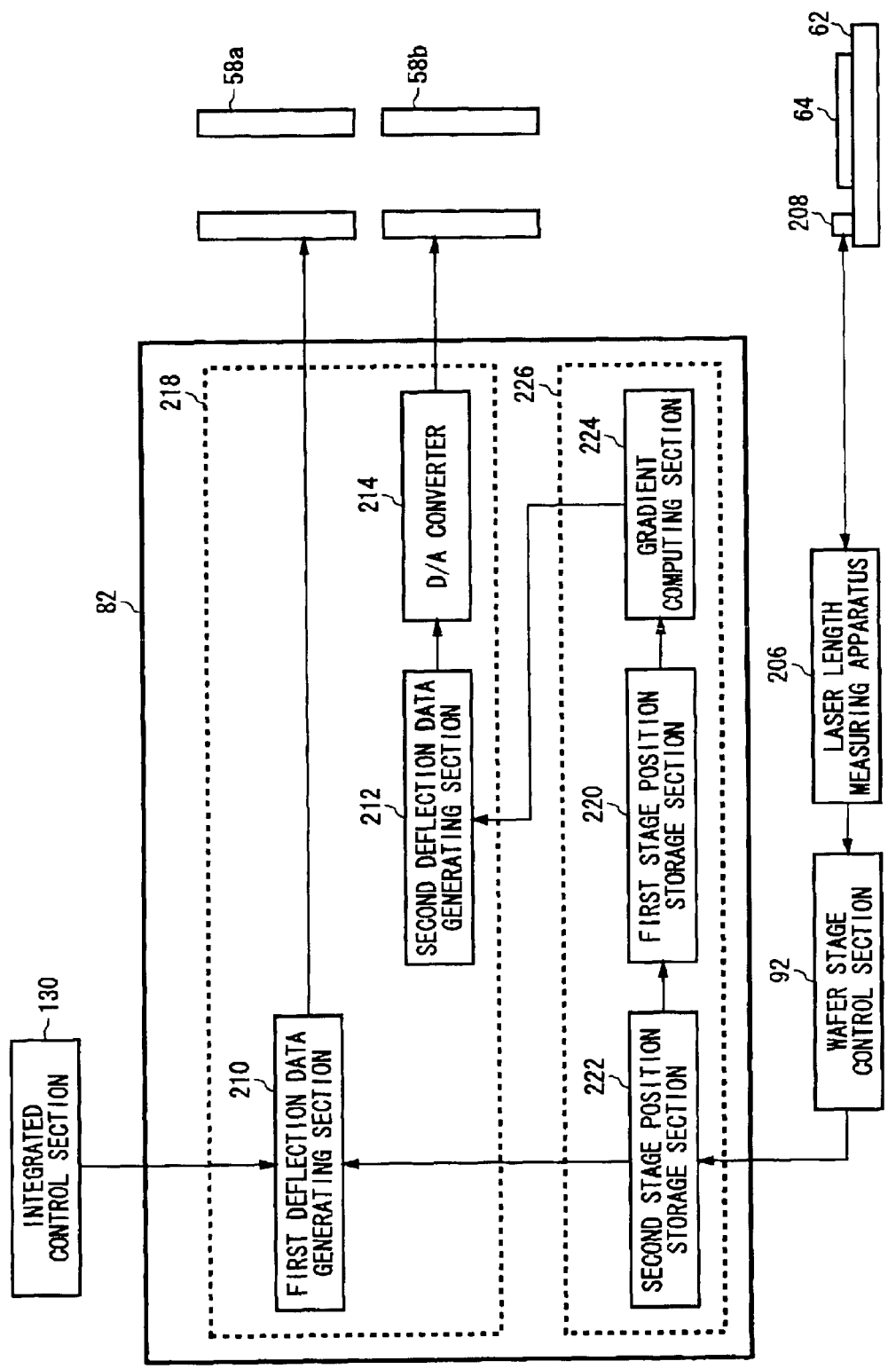
FIG. 5 is a block diagram showing another example of the configuration of the electron beam exposure apparatus.

FIG. 5 is a block diagram showing another example of the configuration of the electron beam exposure apparatus 100.

Operation and configuration of each component of this example are the same as the operation and the configuration explained in relation to FIGS. 1 to 4 unless otherwise explained below.

The electron beam exposure apparatus 100 includes a first sub deflector 58a and a second sub deflector 58b substituting for the sub deflector 58 shown in FIGS. 1 and 2. Each of the first sub deflector 58a and the second sub deflector 58b may have the same function as the sub deflector 58 described above, or the function of the sub deflector 58 may be realized by the two sub deflectors 58a and 58b.

The first deflection data generating section 210 generates the first deflection data based on the position of the wafer stage 62 at the second time point stored on the second stage position storage section 222 and also based on the exposure data acquired from the integrated control section 130, and supplies the first deflection data to the first sub deflector 58a. Then, the first sub deflector 58a deflects the electron beam based on the first deflection data supplied from the first deflection data generating section 210.

The digital/analog converter 214 converts the second deflection data, which is the digital signal generated by the second deflection data generating section 212, into the analog signal, and supplies it to the second sub deflector 58b. Then, the second sub deflector 58b deflects the electron beam based on the second deflection data supplied from the second deflection data generating section 212 through the digital/analog converter 214.

Alternatively, load capacitance of the second sub deflector 58b is lower than that of the first sub deflector 58a, and consequently the deflection amount of the second sub deflector 58b is smaller than that of the first sub deflector 58a. Accordingly, since the second sub deflector 58b deflect the electron beam with fast response even if the deflection amount is very little and follow ability of the deflector increases, the pattern is exposed on the wafer 64 more accurately.

As described above, according to the present invention, there are provided the electron beam exposure apparatus and the deflection amount correction method for realizing the improvement of the throughput and the improvement of the exposure accuracy.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

What is claimed is:

1. An electron beam exposure apparatus for exposing a pattern on a wafer by an electron beam, comprising:
   an electron beam generating section for generating the electron beam;
   a deflecting section for deflecting the electron beam in order to apply the electron beam to a desired position on the wafer;
   a wafer stage on which the wafer is mounted;
   a stage position measuring section for measuring position of said wafer stage at a first time point and at a second time point which is later than the first time point;
   a stage speed computing section for computing moving speed of said wafer stage based on the position of said wafer stage at the first time point and the position of said wafer stage at the second time point, which are measured by said stage position measuring section; and
   a deflection amount correction section for computing position of said wafer stage at exposure time based on the moving speed of said wafer stage measured by said stage speed computing section, and for controlling deflection amount of the electron beam to be deflected by said deflecting section at the exposure time.

2. The electron beam exposure apparatus as claimed in claim 1, wherein said stage speed computing section comprises:
   a first stage position storage section storing thereon the position of said wafer stage at the first time point;
   a second stage position storage section storing thereon the position of said wafer stage at the second time point; and
   a gradient computing section for computing the moving speed of said wafer stage based on the position of said wafer stage at the first time point stored on said first stage position storage section and the position of said wafer stage at the second time point stored on said second stage position storage section, and
   said deflection amount correction section comprises:
   a first deflection data generating section for generating a first deflection data, which is to be supplied to said deflecting section, based on the position of said wafer stage at the second time point stored on said second stage position storage section; and
   a second deflection data generating section for generating a second deflection data indicating the deflection amount corresponding to the moving distance of said wafer stage during a time interval between the second time point and the exposure time based on the moving speed of said wafer stage computed by said gradient computing section, wherein
   said deflection amount correction section supplies the first deflection data and the second deflection data to said deflecting section.

3. The electron beam exposure apparatus as claimed in claim 2, wherein said deflection amount correction section further comprises an adding section for adding the first deflection data and the second deflection data, and supplying the added data to said deflecting section.

4. The electron beam exposure apparatus as claimed in claim 2, wherein said deflecting section comprises:
   a first deflector for deflecting the electron beam based on the first deflection data; and
   a second deflector for deflecting the electron beam based on the second deflection data, wherein
   said deflection amount correction section supplies the first deflection data to said first deflector, and supplies the second deflection data to said second deflector.

5. The electron beam exposure apparatus as claimed in claim 2, wherein said second deflection data generating section computes the moving distance of said wafer stage during a time interval between the second time point and the exposure time by accumulating the moving distance per unit time whenever the unit time is elapsed, the moving distance per unit time being computed by said gradient computing section based on the moving speed of said wafer stage, and the unit time being shorter than the time interval between the first time point and the second time point, and then said second deflection data generating section generates the second deflection data indicating the deflection amount corresponding to the moving distance of said wafer stage during the time interval between the second time point and the exposure time.

6. The electron beam exposure apparatus as claimed in claim 5, wherein said second deflection data generating section computes the moving distance of said wafer stage during the time interval between the second time point and the exposure time by accumulating the moving distance per unit time whenever the unit time is elapsed after the second deflection data is initialized synchronizing with generation of the first deflection data by said first deflection data generating section.

7. The electron beam exposure apparatus as claimed in claim 2, wherein said stage position measuring section measures position of said wafer stage at a predetermined time interval, said first stage position storage section and said second stage position storage section update the position of said wafer stage to store whenever said stage position measuring section measures the position of said wafer stage, said first deflection data generating section acquires exposure data including information indicating the exposure position on the wafer, and generates the first deflection data based on the position of said wafer stage stored on said second stage position storage section when the exposure data are acquired, and said gradient computing section computes the moving speed of said wafer stage based on the position of said wafer stage stored on said first stage position storage section and said second stage position storage section when said first deflection data generating section acquires the exposure data.

8. An electron beam irradiation apparatus for irradiating an electron beam to a predetermined position in an object, comprising:

an electron beam generating section for generating the electron beam;

a deflecting section for deflecting the electron beam in order to apply the electron beam to a desired position on the object;

a stage on which the object is mounted;

a stage position measuring section for measuring position of said stage at a first time point and at a second time point which is later than the first time point;

a stage speed computing section for computing moving speed of said stage based on the position of said stage at the first time point and the position of said stage at the second time point, which are measured by said stage position measuring section; and a deflection amount correction section for computing position of said stage at exposure time based on the moving speed of said stage measured by said stage speed computing section, and for controlling deflection amount of the electron beam to be deflected by said deflecting section at the exposure time.

9. A deflection amount correction method for correcting deflection amount of an electron beam deflected by a deflecting section based on position of a wafer stage on which a wafer is mounted in an electron beam exposure apparatus for exposing a pattern on the wafer by the electron beam, comprising steps of:

measuring position of the wafer stage at a first time point and at a second time point which is later than the first time point;

computing moving speed of the wafer stage based on the position of the wafer stage at the first time point and the position of the wafer stage at the second time point; and computing position of the wafer stage at exposure time based on the moving speed of the wafer stage, and controlling deflection amount of the electron beam at the exposure time.

* * * * *